United States Patent
Moon

(10) Patent No.: US 10,447,203 B2
(45) Date of Patent: Oct. 15, 2019

(54) LOCAL OSCILLATOR GENERATION SYSTEM AND GENERATION METHOD THEREOF

(71) Applicant: FCI INC., Gyeonggi-Do (KR)

(72) Inventor: Jecheol Moon, Gyeonggi-do (KR)

(73) Assignee: FCI INC., Bundang-Gu, Seongnam-Si, Gyeonggi-Do (KR)

(*) Notice: Subject to any disclaimer, the term of this patent is extended or adjusted under 35 U.S.C. 154(b) by 50 days.

(21) Appl. No.: 15/860,951

(22) Filed: Jan. 3, 2018

(65) Prior Publication Data
US 2018/0191301 A1    Jul. 5, 2018

(30) Foreign Application Priority Data
Jan. 3, 2017 (KR) .................. 10-2017-0000687

(51) Int. Cl.
| H03B 5/12 | (2006.01) |
| H03B 19/00 | (2006.01) |
| H03D 7/14 | (2006.01) |

(52) U.S. Cl.
CPC ......... *H03B 5/1228* (2013.01); *H03B 5/1215* (2013.01); *H03B 5/1218* (2013.01); *H03B 5/1243* (2013.01); *H03B 5/1296* (2013.01); *H03B 19/00* (2013.01); *H03D 7/1466* (2013.01); *H03B 2200/0074* (2013.01)

(58) Field of Classification Search
CPC .. H03B 5/1228; H03B 5/1215; H03B 5/1218; H03B 5/1243; H03B 5/1296
USPC ........................................ 327/557, 551–555
See application file for complete search history.

(56) References Cited

U.S. PATENT DOCUMENTS

| 8,031,019 B2 | 10/2011 | Chawla et al. | |
| 2003/0199259 A1* | 10/2003 | Macedo | H03D 7/1425 455/141 |
| 2010/0301928 A1* | 12/2010 | Barth | H04B 1/0028 327/557 |

FOREIGN PATENT DOCUMENTS

KR      20110122170 A      11/2011

* cited by examiner

*Primary Examiner* — Tomi Skibinski
(74) *Attorney, Agent, or Firm* — Muncy, Geissler, Olds & Lowe, P.C.

(57) ABSTRACT

A local oscillator generation system includes a first frequency divider configured to divide frequencies of a first voltage controlled oscillator signal and a second voltage controlled oscillator signal by 2, and output a first divided signal and a second divided signal; a mixer configured to mix the first voltage controlled oscillator signal, the second voltage controlled oscillator signal, the first divided signal, and the second divided signal, and output a first frequency mixed signal and a second frequency mixed signal; a transimpedance amplifier configured to amplify the first frequency mixed signal and the second frequency mixed signal, and output a first amplified signal and a second amplified signal; and a band-pass filter configured to filter the first amplified signal and the second amplified signal, and output a first filtered signal and a second amplified signal.

14 Claims, 5 Drawing Sheets

LOCAL OSCILLATOR GENERATION SYSTEM AND GENERATION METHOD THEREOF

BACKGROUND

Field

The present disclosure relates to a local oscillator (LO) generation system and generation method thereof, and more particularly to a local oscillator generation system and generation method thereof capable of eliminating a pulling phenomenon and harmonic components of a voltage controlled oscillator (VCO) in a radio frequency (RF) system, e.g., a wireless network.

Background

In a general wireless network system, when a transmitter and a voltage controlled oscillator (VCO) use the same frequency or the VCO uses a harmonic frequency of the transmitter, an output power of the transmitter is applied to the VCO, so that a frequency of the VCO is unstable. This is called as a VCO pulling phenomenon. Usually, in order to avoid the phenomenon, the VCO is oscillated in a fraction of a frequency of the transmitter, and the frequency which can be used in the transmitter is generated by a mixer.

However, in a conventional local oscillator (LO) generation system, a problem that harmonic components are high still exists even if an active mixer or a passive mixer is used.

PATENT DOCUMENT (0001) Korean Patent Publication No. 10-2011-0122170 (A device for wireless communications comprising a VCO, an apparatus, and a method for generating a frequency mixed signal or a frequency divided signal published on Nov. 9, 2011).

SUMMARY OF THE DISCLOSURE

The present disclosure is configured to solve the above-mentioned technical problems, and an objective thereof is to provide a local oscillator generation system and a generation method thereof capable of eliminate the VCO pulling phenomenon of a VCO and harmonic components.

A band-pass filter in accordance with a preferred embodiment of the present disclosure includes a base band-pass filter circuit configured to filter signals and output differential signals via a first filter output node and a second filter output node; and a bandwidth adjusting circuit connected to the first filter output node and the second filter output node and configured to narrow a passband of the base band-pass filter circuit.

In detail, the base band-pass filter circuit preferably includes a resonant frequency setting circuit connected between the first filter output node and the second filter output node to set a resonant frequency; a first transistor, a drain terminal of the first transistor and a gate terminal of the first transistor respectively connected to the first filter output node and the second filter output node; a second transistor, a gate terminal of the second transistor and a drain terminal of the second transistor respectively connected to the first filter output node and the second filter output node; and a resonant frequency adjusting circuit configured to adjust the resonant frequency. Furthermore, the resonant frequency adjusting circuit includes a varactor.

Preferably, the bandwidth adjusting circuit is configured to increase a transimpedance component of the base band-pass filter circuit. In detail, the bandwidth adjusting circuit includes a third transistor, a gate terminal of the third transistor receiving one of the differential signals, and a drain terminal of the third transistor connected to the first filter output node outputting a signal; and a fourth transistor, a gate terminal of the fourth transistor receiving the other of the differential signals, and a drain terminal of the fourth transistor connected to the second filter output node outputting a signal.

A filtering method in accordance with a preferred embodiment of the present disclosure includes filtering signals and outputting differential signals via a first filter output node and a second filter output node in a base filtering step; and narrowing a passband in the base filtering step and outputting a narrowed result via the first filter output node and the second filter output node.

In detail, the base filtering step includes setting a resonant frequency in a resonant frequency setting step; connecting a drain terminal of a first transistor and a gate terminal of the first transistor to the first filter output node and the second filter output node respectively in a first direct current bias step; connecting a gate terminal of a second transistor and a drain terminal of the second transistor respectively in a second direct current bias step; and adjusting the resonant frequency in a resonant frequency adjusting step.

Furthermore, in the bandwidth adjusting step, the passband in the base filtering step is narrowed by increasing a transimpedance component. In detail, the bandwidth adjusting step is implemented using a third transistor and a fourth transistor. A gate terminal of the third transistor receives one of differential signals, and a drain terminal of the third transistor connected to the first filter output node outputs a signal. A gate terminal of the fourth transistor receives the other of the differential signals, and a drain terminal of the fourth transistor connected to the second filter output node outputs a signal.

A local oscillator generation system in accordance with a preferred embodiment of the present disclosure includes a first frequency divider configured to receive differential signals including a first voltage controlled oscillator signal and a second voltage controlled oscillator signal outputted by a voltage controlled oscillator, configured to divide frequencies of the first voltage controlled oscillator signal and the second voltage controlled oscillator signal by 2, and configured to output a first divided signal and a second divided signal; a mixer configured to receive and mix the first voltage controlled oscillator signal, the second voltage controlled oscillator signal, the first divided signal, and the second divided signal, and configured to output a first frequency mixed signal and a second frequency mixed signal; a transimpedance amplifier configured to receive and amplify the first frequency mixed signal and the second frequency mixed signal, and configured to output a first amplified signal and a second amplified signal; and a band-pass filter configured to receive and filter the first amplified signal and the second amplified signal, and configured to output a first filtered signal and a second amplified signal.

The band-pass filter includes a base band-pass filter circuit configured to filter the first amplified signal and the second amplified signal and configured to output the first filtered signal and the second amplified signal via a first filter output node and a second filter output node; and a bandwidth adjusting circuit connected to the first filter output node and the second filter output node and configured to narrow a passband of the base band-pass filter circuit. In detail, the base band-pass filter circuit includes a resonant frequency setting circuit connected between the first filter output node and the second filter output node to set a resonant frequency; a first transistor, a drain terminal of the first transistor and a gate terminal of the first transistor respectively connected to the first filter output node and the second filter output node; a second transistor, a gate terminal of the second transistor and a drain terminal of the second transistor respectively connected to the first filter output node and the second filter output node; and a resonant frequency adjusting circuit configured to adjust the resonant frequency. The resonant frequency adjusting circuit includes a varactor. Moreover, the bandwidth adjusting circuit is configured to increase a transimpedance component of the base band-pass filter circuit. In detail, the bandwidth adjusting circuit includes a third transistor, a gate terminal of the third transistor receiving one of the differential signals, and a drain terminal of the third transistor connected to the first filter output node outputting a signal; and a fourth transistor, a gate terminal of the fourth transistor receiving the other of the differential signals, and a drain terminal of the fourth transistor connected to the second filter output node outputting a signal.

Moreover, the mixer is a passive mixer, and the transimpedance amplifier is an inverter-type transimpedance amplifier.

A local oscillator generation method in accordance with a preferred embodiment of the present disclosure includes receiving differential signals including a first voltage controlled oscillator signal and a second voltage controlled oscillator signal outputted by a voltage controlled oscillator, dividing frequencies of the first voltage controlled oscillator signal and the second voltage controlled oscillator signal by 2, and outputting a first divided signal and a second divided signal in a frequency dividing step; receiving and mixing the first voltage controlled oscillator signal, the second voltage controlled oscillator signal, the first divided signal, and the second divided signal, and outputting a first frequency mixed signal and a second frequency mixed signal in a mixing step; receiving and amplifying the first frequency mixed signal and the second frequency mixed signal, and outputting a first amplified signal and a second amplified signal in an amplifying step; and receiving and filtering the first amplified signal and the second amplified signal, and outputting a first filtered signal and a second amplified signal in a filtering step.

In detail, the filtering step includes filtering the first amplified signal and the second amplified signal and outputting differential signals via a first filter output node and a second filter output node in a base filtering step; and narrowing a passband in the base filtering step and outputting a narrowed result via the first filter output node and the second filter output node. Moreover, the base filtering step includes setting a resonant frequency in a resonant frequency setting step; connecting a drain terminal of a first transistor and a gate terminal of the first transistor to the first filter output node and the second filter output node respectively in a first direct current bias step; connecting a gate terminal of a second transistor and a drain terminal of the second transistor respectively in a second direct current bias step; and adjusting the resonant frequency in a resonant frequency adjusting step.

Moreover, in the bandwidth adjusting step, the passband in the base filtering step is narrowed by increasing a transimpedance component. In detail, the bandwidth adjusting step is implemented using a third transistor and a fourth transistor. A gate terminal of the third transistor receives one of differential signals, and a drain terminal of the third transistor connected to the first filter output node outputs a signal. A gate terminal of the fourth transistor receives the other of the differential signals, and a drain terminal of the fourth transistor connected to the second filter output node outputs a signal.

The local oscillator generation system and the generation method thereof in accordance with the present disclosure can eliminate the VCO pulling phenomenon of the voltage controlled oscillator and the harmonic components.

DETAILED DESCRIPTION OF ILLUSTRATED EMBODIMENTS

Hereinafter, an LO generation system and generation method thereof in accordance with embodiments of the present disclosure will be described with reference to the accompanying drawings.

The following embodiments of the present disclosure are intended to specify the present disclosure and thus do not limit the scope of the present disclosure. Embodiments derived from the specification of the present disclosure and the embodiments by those skilled in the art can be explained to belong to the scope of the present disclosure.

Figure 1:
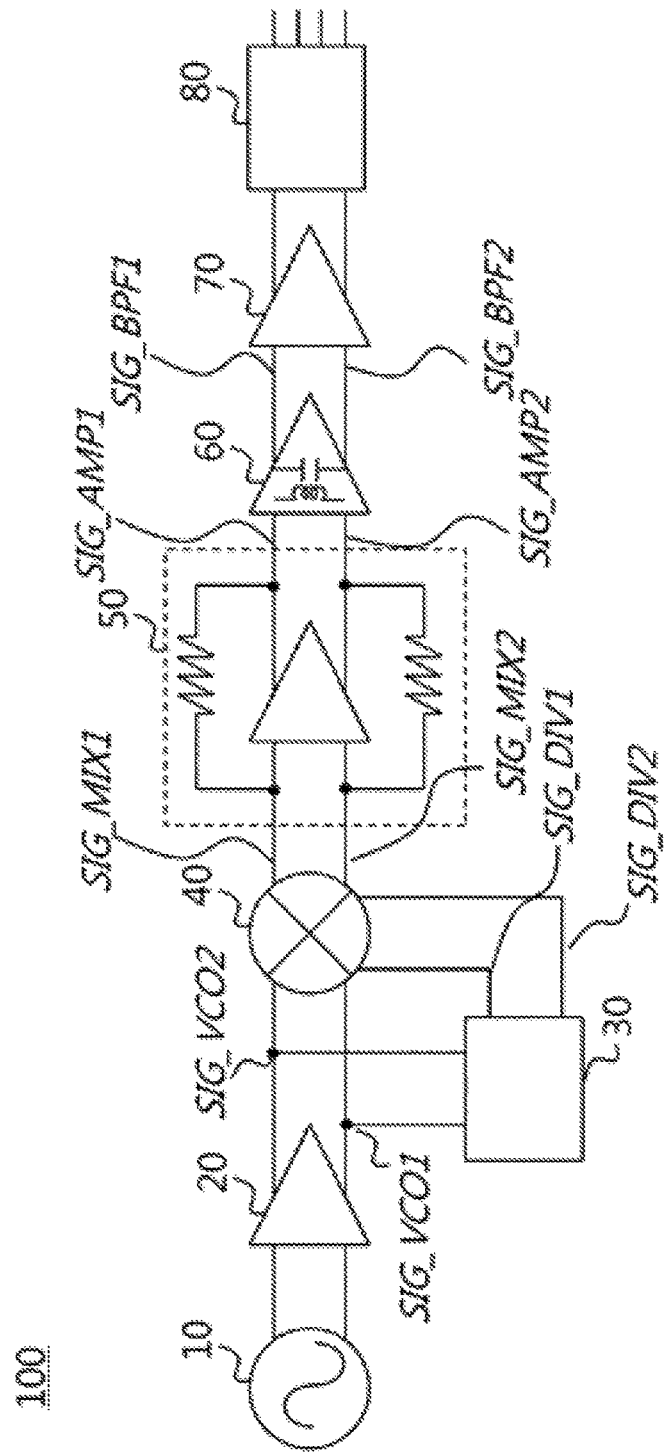
FIG. 1 illustrates a local oscillator (LO) generation system in accordance with a preferred embodiment of the present disclosure.

First, FIG. 1 illustrates a local oscillator (LO) generation system 100 in accordance with a preferred embodiment of the present disclosure.

Operations of the LO generation system 100 of the present disclosure are described briefly as follows.

Taking a wireless network system using a 2.4 GHz frequency band for example is described as follows. A voltage controlled oscillator (VCO) 10 generates a local oscillator of 2.4 GHz. A mixer 40 generates a signal of (3.2 GHz+1.6 GHz) and a signal of (3.2 GHz−1.6 GHz). The signal of (3.2 GHz−1.6 GHz) is required to be eliminated. A band-pass filter 60 eliminates this signal. A signal passing through the band-pass filter 60 is only the signal of (3.2 GHz+1.6 GHz), i.e., the signal of 4.8 GHz. The signal of 4.8 GHz is divided by 2 is 2.4 GHz.

The operations of the LO generation system 100 in accordance with a preferred embodiment of the present disclosure are described in detail as follows.

It can be understood from FIG. 1 that the LO generation system 100 in accordance with the preferred embodiment of the present disclosure includes the VCO 10, a first buffer 20, a first frequency divider 30, the mixer 40, a transimpedance amplifier 50, the band-pass filter 60, a second buffer 70, and a second frequency divider 80.

The first frequency divider 30 is constituted by the following operations. Differential signals which are acquired after an output of the VCO 10 is buffered by the first buffer 20 are received. That is, the differential signals outputted by the VCO 10 include a first VCO signal SIG_VCO1 and a second VCO signal SIG_VCO2. Frequencies of the first VCO signal SIG_VCO1 and the second VCO signal SIG_VCO2 are divided by 2. A first divided signal SIG_DIV1 and a second divided signal SIG_DIV2 are outputted.

The mixer 40 is constituted by the following operations. The first VCO signal SIG_VCO1, the second VCO signal SIG_VCO2, the first divided signal SIG_DIV1, and the second divided signal SIG_DIV2 are received and mixed. A first frequency mixed signal SIG_MIX1 and a second frequency mixed signal SIG_MIX2 are outputted.

The transimpedance amplifier 50 is constituted by the following operations. The first frequency mixed signal SIG_MIX1 and the second frequency mixed signal SIG_MIX2 are received and amplified. A first amplified signal SIG_AMP1 and a second amplified signal SIG_AMP2 are outputted.

Furthermore, the band-pass filter 60 is constituted by the following operations. The first amplified signal SIG_AMP1 and the second amplified signal SIG_AMP2 are received and filtered. A first filtered signal SIG_BPF1 and a second amplified signal SIG_BPF 2 are outputted.

Figure 2:
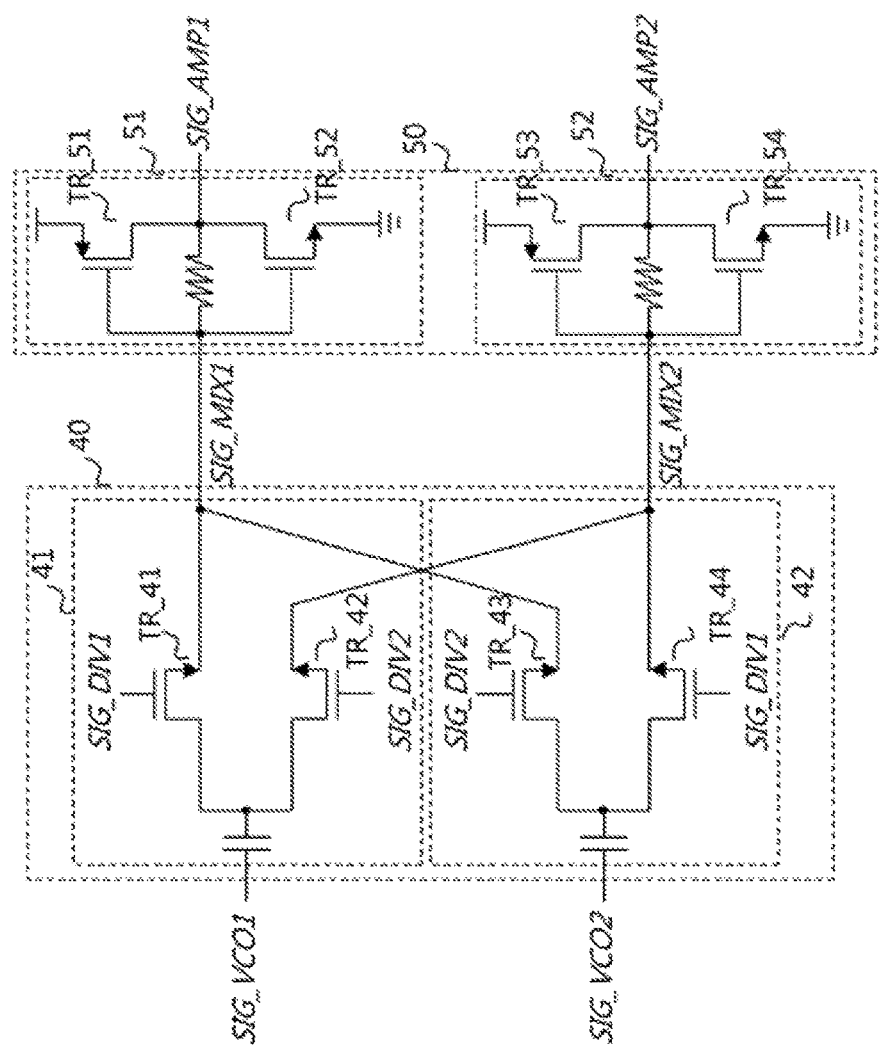
FIG. 2 illustrates a circuit diagram of a mixer and a transimpedance amplifier in accordance with a preferred embodiment of the present disclosure.

FIG. 2 illustrates a circuit diagram of the mixer 40 and the transimpedance amplifier 50 in accordance with a preferred embodiment of the present disclosure.

It can be understood from FIG. 2 that the mixer 40 is constituted by a first mixer circuit 41 and a second mixer circuit 42.

The first mixer circuit 41 includes a pair of transistors TR_41 and TR_42. The first VCO signal SIG_VCO1 is inputted to a node at which drain terminals of the transistors TR_41 and TR_42 are connected together. The first divided signal SIG_DIV1 and the second divided signal SIG_DIV2 are respectively inputted to a gate terminal of the transistor TR_41 and a gate terminal of the transistor TR_42.

The second mixer circuit 42 includes a pair of transistors TR_43 and TR_44. The second VCO signal SIG_VCO2 is inputted to a node at which drain terminals of the transistors TR_43 and TR_44 are connected together. The second divided signal SIG_DIV2 and the first divided signal SIG_DIV1 are respectively inputted to a gate terminal of the transistor TR_43 and a gate terminal of the transistor TR_44.

Furthermore, a source terminal of the transistor TR_41 and a source of the transistor TR_43 are connected and output the first frequency mixed signal SIG_MIX1. Similarly, a source terminal of the transistor TR_42 and a source of the transistor TR_44 are connected and output the second frequency mixed signal SIG_MIX2.

Preferably, the mixer 40 of the present disclosure is a passive mixer.

Preferably, in order to amplify frequency components in a GHz frequency band, the transimpedance amplifier 50 of the present disclosure is an inverter-type transimpedance amplifier. The transimpedance amplifier 50 of the present disclosure includes a first amplifying circuit 51 and a second amplifying circuit 52.

The first amplifying circuit 51 includes a pair of transistors TR_51 and TR_52 which are connected in series. A gate terminal of the transistor TR_51 and a gate terminal of the transistor TR_52 are connected and receive the first frequency mixed signal SIG_MIX1. Furthermore, a drain terminal of the transistor TR_51 and a drain of the transistor TR_52 are connected and output the first amplified signal SIG_AMP1. Furthermore, the first amplifying circuit 51 is constituted as a feedback loop by a resistor.

Similarly, the second amplifying circuit 52 includes a pair of transistors TR_53 and TR_54 which are connected in series. A gate terminal of the transistor TR_53 and a gate terminal of the transistor TR_54 are connected and receive the second frequency mixed signal SIG_MIX2. Furthermore, a drain terminal of the transistor TR_53 and a drain of the transistor TR_54 are connected and output the second amplified signal SIG_AMP2. Furthermore, the first amplifying circuit 52 is constituted as a feedback loop by a resistor.

When the transimpedance amplifier 50 is connected to the output of the mixer 40, the mixer 40 performs operations based on current outputs, thereby acquiring a gain greater than a voltage mixer. Furthermore, when the passive mixer is used, flicker noise does not add to the LO signal. Accordingly, noise performance of the LO signal does not decreased. Moreover, the inverter-type transimpedance amplifier 50 is suitable for driving a signal of several GHz.

Figure 3:
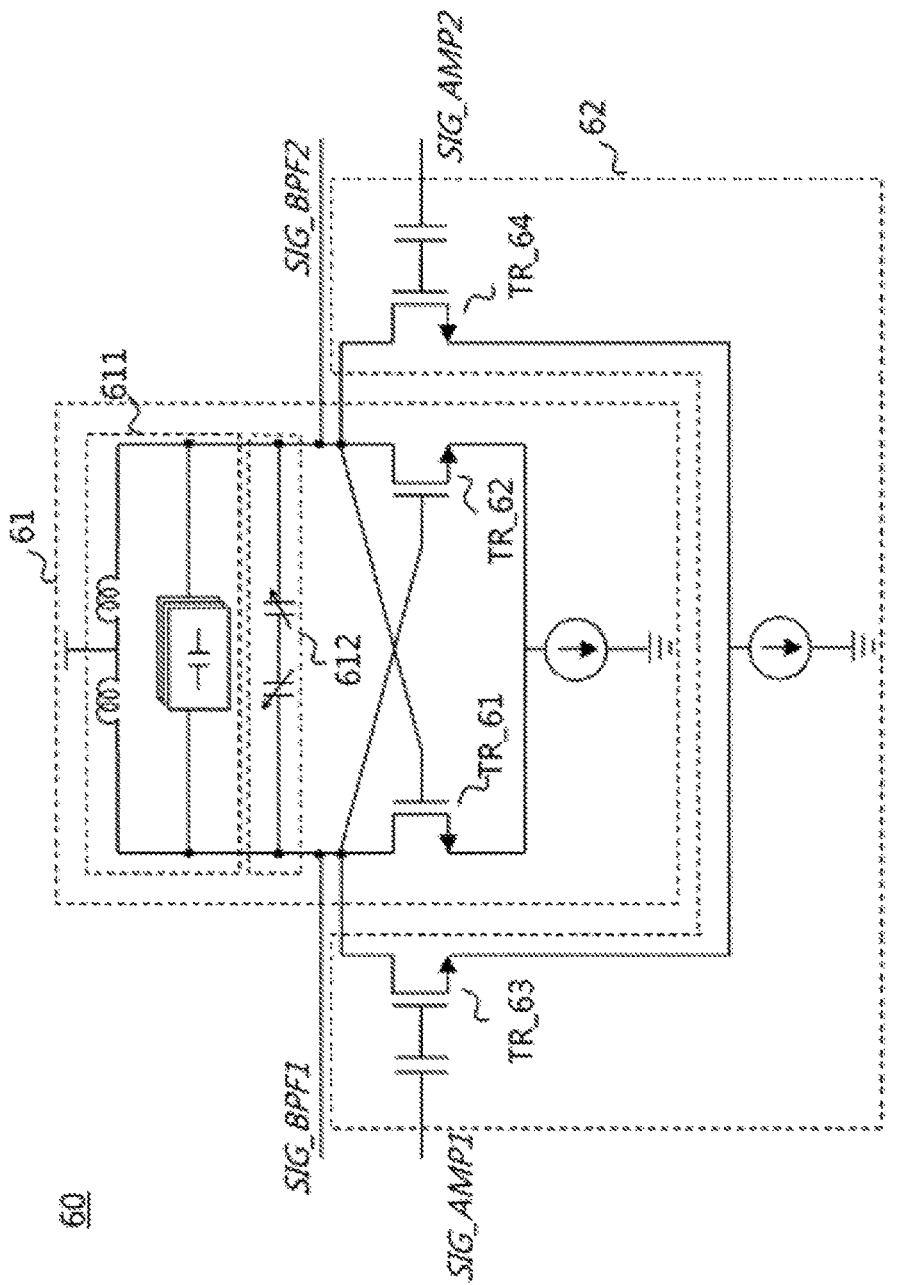
FIG. 3 illustrates a band-pass filter in accordance with a preferred embodiment of the present disclosure.

FIG. 3 illustrates the band-pass filter 60 in accordance with a preferred embodiment of the present disclosure.

It can be understood from FIG. 3 that the band-pass filter 60 in accordance with the preferred embodiment of the present disclosure includes a base band-pass filter circuit 61 and a bandwidth adjusting circuit 62.

The base band-pass filter circuit 61 is constituted by the following operations. Signals are filtered. The first filtered signal SIG_BPF1 and the second amplified signal SIG_BPF 2 are respectively outputted via a first filter output node and a second filter output node.

Furthermore, the bandwidth adjusting circuit 62 is connected to the first filter output node and the second filter output node and is constituted by the following operations. A passband of the base band-pass filter circuit 61 is narrowed and outputted via the first filter output node and the second filter output node.

The base band-pass filter circuit 61 includes a resonant frequency setting circuit 611, a resonant frequency adjusting circuit 612, a first transistor TR_61, and a second transistor TR_62.

The resonant frequency setting circuit 611 is connected between the first filter output node and the second filter output node to set a resonant frequency. In detail, the resonant frequency setting circuit 611 includes a first inductor, a second inductor, and a capacitor circuit. The capacitor circuit can include a plurality of capacitor sets which are respectively connected to one of a plurality of switches, thereby changing the set resonant frequency easily.

The resonant frequency adjusting circuit 612 is constituted by finely adjusting the resonant frequency set by the resonant frequency setting circuit 611. The resonant frequency adjusting circuit 612 is characterized by including a varactor.

The first transistor TR_61 functions as follows. A drain terminal and a gate terminal are respectively connected to the first filter output node and the second filter output node to perform a direct current bias. Similarly, the second transistor TR_62 functions as follows. A gate terminal and a drain terminal are respectively connected to the first filter output node and the second filter output node to perform a direct current bias.

A negative resistance component, which capable of eliminating parasitic resistance components of the first inductor and the second inductor included in the resonant frequency setting circuit 611, can be generated by the first transistor TR_61 and the second transistor TR_62.

The bandwidth adjusting circuit 62 is characterized by including a third transistor TR_63 and a fourth transistor TR_64. A gate terminal of the third transistor TR_63 receives the first amplified signal SIG_AMP1 serving as one of differential signals. A drain terminal of the third transistor TR_63 connected to the first filter output node outputs a signal. A gate terminal of the fourth transistor TR_64 receives the second amplified signal SIG_AMP2 serving as the other of the differential signals. A drain terminal of the fourth transistor TR_64 connected to the second filter output node outputs a signal. It can be understood that the bandwidth adjusting circuit 62 is configured to improve filter performance of the base band-pass filter circuit 61 and is constituted by a negative-Gm cell. That is, the bandwidth adjusting circuit 62 is characterized by increasing a transimpedance component of the base band-pass filter circuit 61.

Furthermore, the band-pass filter 60 of the present disclosure further includes the resonant frequency adjusting circuit 612. The resonant frequency adjusting circuit 612 is configured to ease a process variation in a high transimpedance manufacturing process. The process variation in the high transimpedance manufacturing process leads to an unexpected oscillation or generates a gain variation of a filtering frequency.

As mentioned above, the band-pass filter 60 of the present disclosure can increase the high transimpedance component and have an advantage of harmonic eliminating performance better than conventional band-pass filters.

Moreover, the band-pass filter 60 of the present disclosure has a high band-pass characteristic in contrast to a disadvantage of a narrow filter frequency band. As such, the band-pass filter 60 of the present disclosure is preferably suitable in wide band applications. The band-pass filter 60 can include the capacitor circuit constituted by the capacitor sets capable of controlling a frequency band. Filter effect can be maximized in an expected frequency band by controlling the capacitor sets.

Figure 4:
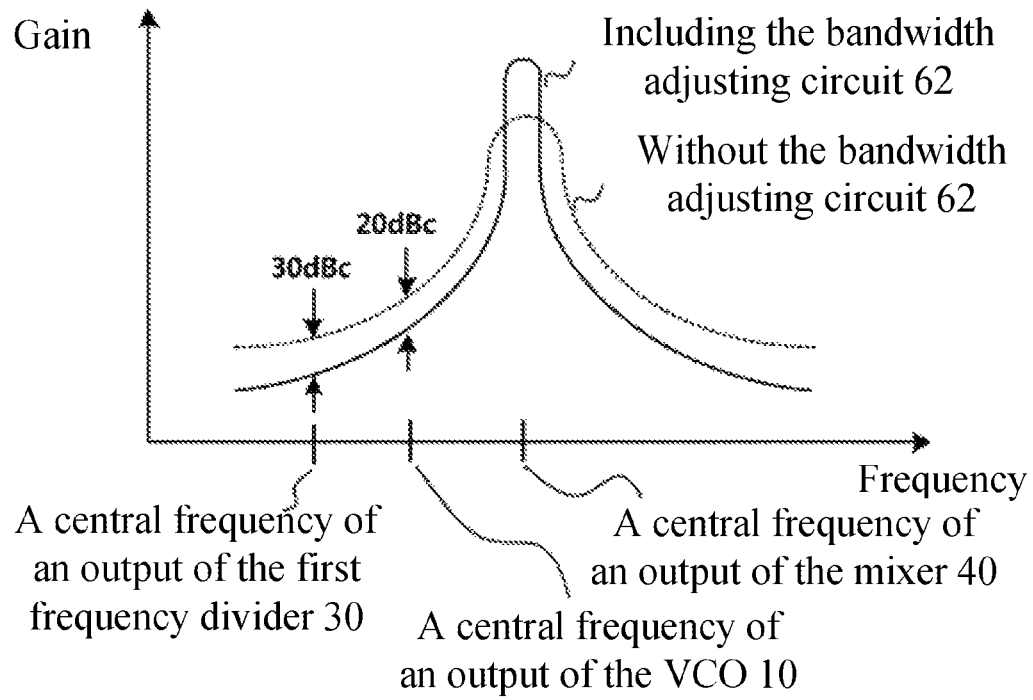
FIG. 4 illustrates characteristic diagrams of the band-pass filter including a bandwidth adjusting circuit and without the bandwidth adjusting circuit.

FIG. 4 illustrates characteristic diagrams of the band-pass filter 60 including the bandwidth adjusting circuit 62 and without the bandwidth adjusting circuit 62. It can be understood from FIG. 4, performance can be increased by 10 dBc when the band-pass filter 60 includes the bandwidth adjusting circuit 62.

Figure 5:
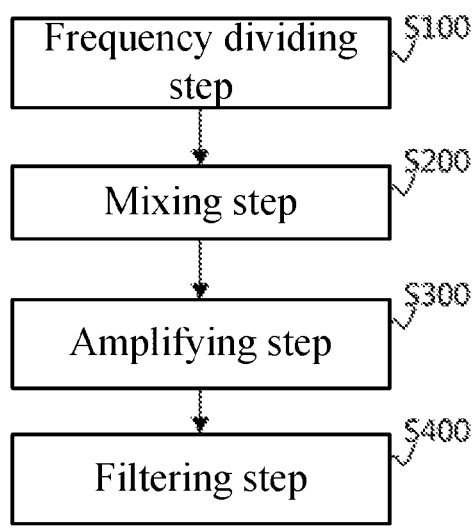
FIG. 5 illustrates a flowchart of an LO generation method in accordance with a preferred embodiment of the present disclosure.

FIG. 5 illustrates a flowchart of an LO generation method in accordance with a preferred embodiment of the present disclosure.

The LO generation method in accordance with the preferred embodiment of the present disclosure uses the above-mentioned LO generation system 100 in accordance with the preferred embodiment of the present disclosure, and thus should include all features of the LO generation system 100 in accordance with the preferred embodiment of the present disclosure even if not described.

It can be understood from FIG. 5 that the LO generation method in accordance with the preferred embodiment of the present disclosure includes the following steps. In a frequency dividing step S100, the first VCO signal SIG_VCO1 and the second VCO signal SIG_VCO2, which serve as differential signals outputted by the VCO 10, are received. The frequencies of the first VCO signal SIG_VCO1 and the second VCO signal SIG_VCO2 are divided by 2. The first divided signal SIG_DIV1 and the second divided signal SIG_DIV2 are outputted. In a mixing step S200, the first VCO signal SIG_VCO1, the second VCO signal SIG_VCO2, the first divided signal SIG_DIV1, and the second divided signal SIG_DIV2 are received and mixed. The first frequency mixed signal SIG_MIX1 and the second frequency mixed signal SIG_MIX2 are outputted. In an amplifying step S300, the first frequency mixed signal SIG_MIX1 and the second frequency mixed signal SIG_MIX2 are received and amplified by the transimpedance amplifier 50. The first amplified signal SIG_AMP1 and the second amplified signal SIG_AMP2 are outputted. In a filtering step S400, the first amplified signal SIG_AMP1 and the second amplified signal SIG_AMP2 are received and filtered. The first filtered signal SIG_BPF1 and the second amplified signal SIG_BPF 2 are outputted.

Figure 6:
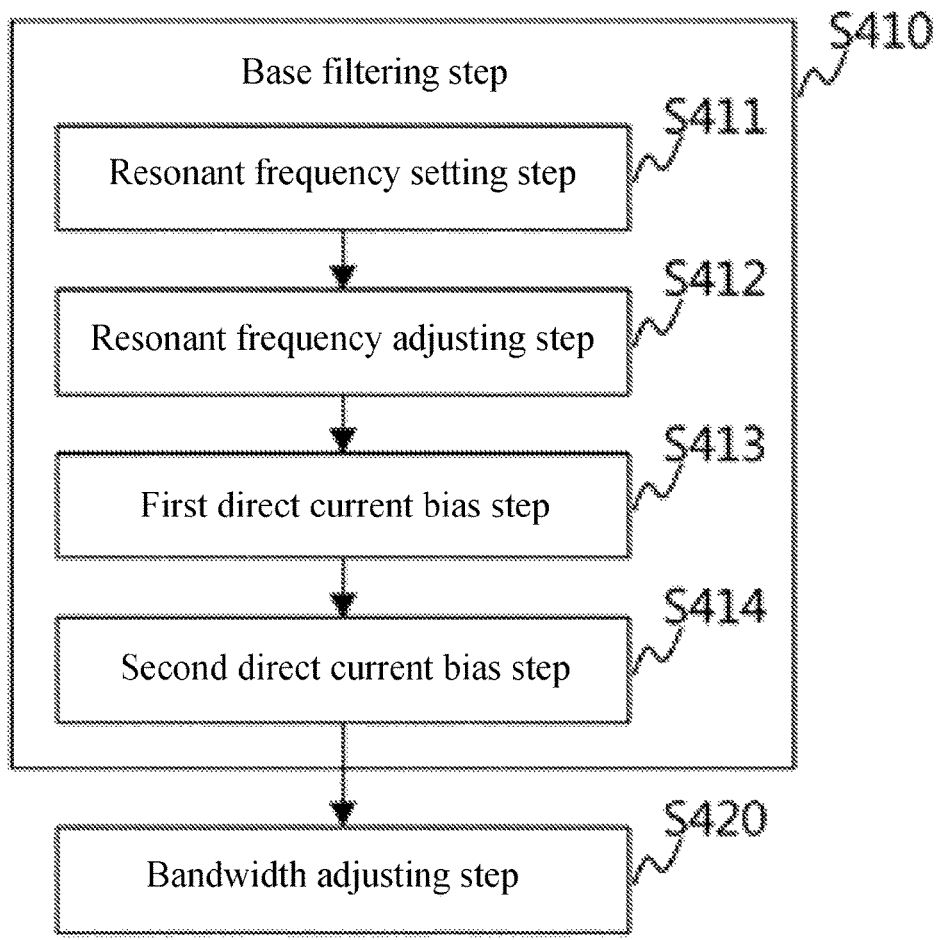
FIG. 6 illustrates a flowchart of a filtering step S400 in accordance with a preferred embodiment of the present disclosure.

FIG. 6 illustrates a flowchart of the filtering step S400 in accordance with a preferred embodiment of the present disclosure.

The filtering step S400 in accordance with the preferred embodiment of the present disclosure uses the above-mentioned band-pass filter 60 in accordance with the preferred embodiment of the present disclosure, and thus should include all features of the band-pass filter 60 in accordance with the preferred embodiment of the present disclosure even if not described.

It can be understood from FIG. 6 that the filtering step S400 includes the following steps. In a base filtering step S410, the signals are filtered. The first filtered signal SIG_BPF1 and the second amplified signal SIG_BPF 2 are respectively outputted via the first filter output node and the second filter output node. In a bandwidth adjusting step S420, a passband in the base filtering step is narrowed and outputted via the first filter output node and the second filter output node.

The base filtering step S410 includes the following steps. In a resonant frequency setting step S411, the resonant frequency is set. In a resonant frequency adjusting step S412, the resonant frequency is adjusted. In a first direct current bias step, the drain terminal of the first transistor TR_61 and the gate terminal of the first transistor TR_61 are respectively connected to the first filter output node and the second filter output node to perform a direct current bias. In a second direct current bias step S414, the gate terminal of the second transistor TR_62 and the drain terminal of the second transistor TR_62 are respectively connected to the first filter output node and the second filter output node to perform a direct current bias.

The negative resistance component, which capable of eliminating the parasitic resistance components of the first inductor and the second inductor included in the resonant frequency setting circuit 611, can be generated in step S413 and step S414.

In the bandwidth adjusting step S420, the passband in the base filtering step S410 is narrowed by increasing the transimpedance component. In detail, the bandwidth adjusting step S420 is characterized by being implemented using the third transistor TR_63 and the fourth transistor TR_64. The gate terminal of the third transistor TR_63 receives the first amplified signal SIG_AMP1 serving as one of differential signals. The drain terminal of the third transistor TR_63 connected to the first filter output node outputs a signal. The gate terminal of the fourth transistor TR_64 receives the second amplified signal SIG_AMP2 serving as the other of the differential signals. The drain terminal of the fourth transistor TR_64 connected to the second filter output node outputs a signal.

As mentioned above, it can be understood that the LO generation system 100 and the generation method thereof can eliminate the VCO pulling phenomenon of the VCO 10 and the harmonic components.

While the embodiments of the present disclosure have been shown and described, it will be understood the above-mentioned embodiments are merely exemplary to explain the present disclosure and not to be construed as limiting the present disclosure. Various changes, modifications, equivalents, and variants may be made by those skilled in the art from the scope of the present disclosure.

What is claimed is:

1. A local oscillator generation system, comprising:
    a first frequency divider configured to receive differential signals including a first voltage controlled oscillator signal and a second voltage controlled oscillator signal outputted by a voltage controlled oscillator, configured to divide frequencies of the first voltage controlled oscillator signal and the second voltage controlled oscillator signal by 2, and configured to output a first divided signal and a second divided signal;
    a mixer configured to receive and mix the first voltage controlled oscillator signal, the second voltage controlled oscillator signal, the first divided signal, and the second divided signal, and configured to output a first frequency mixed signal and a second frequency mixed signal;
    a transimpedance amplifier configured to receive and amplify the first frequency mixed signal and the second frequency mixed signal, and configured to output a first amplified signal and a second amplified signal; and
    a band-pass filter configured to receive and filter the first amplified signal and the second amplified signal, and configured to output a first filtered signal and a second amplified signal.

2. The local oscillator generation system of claim 1, wherein the band-pass filter comprises:
    a base band-pass filter circuit configured to filter the first amplified signal and the second amplified signal and configured to output the first filtered signal and the second amplified signal via a first filter output node and a second filter output node; and
    a bandwidth adjusting circuit connected to the first filter output node and the second filter output node and configured to narrow a passband of the base band-pass filter circuit.

3. The local oscillator generation system of claim 2, wherein the base band-pass filter circuit comprises:
    a resonant frequency setting circuit connected between the first filter output node and the second filter output node to set a resonant frequency;
    a first transistor, a drain terminal of the first transistor and a gate terminal of the first transistor respectively connected to the first filter output node and the second filter output node; and
    a second transistor, a gate terminal of the second transistor and a drain terminal of the second transistor respectively connected to the first filter output node and the second filter output node.

4. The local oscillator generation system of claim 2, wherein the base band-pass filter circuit further comprises:
    a resonant frequency adjusting circuit configured to adjust the resonant frequency.

5. The local oscillator generation system of claim 3, wherein the resonant frequency adjusting circuit comprises a varactor.

6. The local oscillator generation system of claim 2, wherein the bandwidth adjusting circuit is configured to increase a transimpedance component of the base band-pass filter circuit.

7. The local oscillator generation system of claim 2, wherein the bandwidth adjusting circuit comprises:
    a third transistor, a gate terminal of the third transistor receiving the first amplified signal, and a drain terminal of the third transistor connected to the first filter output node outputting a signal; and
    a fourth transistor, a gate terminal of the fourth transistor receiving the second amplified signal, and a drain terminal of the fourth transistor connected to the second filter output node outputting another signal.

8. The local oscillator generation system of claim 1, wherein the mixer is a passive mixer, and the transimpedance amplifier is an inverter-type transimpedance amplifier.

9. A local oscillator generation method, comprising:
    receiving differential signals including a first voltage controlled oscillator signal and a second voltage controlled oscillator signal outputted by a voltage controlled oscillator, dividing frequencies of the first voltage controlled oscillator signal and the second voltage controlled oscillator signal by 2, and outputting a first divided signal and a second divided signal in a frequency dividing step;
    receiving and mixing the first voltage controlled oscillator signal, the second voltage controlled oscillator signal, the first divided signal, and the second divided signal, and outputting a first frequency mixed signal and a second frequency mixed signal in a mixing step;
    receiving and amplifying the first frequency mixed signal and the second frequency mixed signal, and outputting a first amplified signal and a second amplified signal in an amplifying step; and
    receiving and filtering the first amplified signal and the second amplified signal, and outputting a first filtered signal and a second amplified signal in a filtering step.

10. The local oscillator generation method of claim 9, wherein the filtering step comprises:
    filtering the first amplified signal and the second amplified signal and outputting differential signals via a first filter output node and a second filter output node in a base filtering step; and
    narrowing a passband in the base filtering step and outputting a narrowed result via the first filter output node and the second filter output node in a bandwidth adjusting step.

11. The local oscillator generation method of claim 10, wherein the base filtering step comprises:
    setting a resonant frequency in a resonant frequency setting step;
    connecting a drain terminal of a first transistor and a gate terminal of the first transistor to the first filter output node and the second filter output node respectively in a first direct current bias step; and
    connecting a gate terminal of a second transistor and a drain terminal of the second transistor respectively in a second direct current bias step.

12. The local oscillator generation method of claim 11, wherein the base filtering step further comprises:
    adjusting the resonant frequency in a resonant frequency adjusting step.

13. The local oscillator generation method of claim 10, wherein in the bandwidth adjusting step, the passband in the base filtering step is narrowed by increasing a transimpedance component.

14. The local oscillator generation method of claim 10, wherein the bandwidth adjusting step is implemented using a third transistor and a fourth transistor,
- a gate terminal of the third transistor receives the first amplified signal, and a drain terminal of the third transistor connected to the first filter output node outputs a signal,
- a gate terminal of the fourth transistor receives the second amplified signal, and a drain terminal of the fourth transistor connected to the second filter output node outputs another signal.

\* \* \* \* \*